United States Patent [19]

Frederiksen

[11] 4,136,357
[45] Jan. 23, 1979

[54] INTEGRATED CIRCUIT PACKAGE WITH OPTICAL INPUT COUPLER

[75] Inventor: Thomas M. Frederiksen, San Jose, Calif.

[73] Assignee: National Semiconductor Corporation, Santa Clara, Calif.

[21] Appl. No.: 839,137

[22] Filed: Oct. 3, 1977

[51] Int. Cl.² .................. H01L 23/28; H01L 27/14; H01L 31/00
[52] U.S. Cl. ........................... 357/72; 357/17; 357/30; 357/74; 29/588; 174/52 PE
[58] Field of Search .................. 357/17, 19, 30, 74, 357/72, 75, 38, 81; 175/52 PE; 29/588, 572

[56] References Cited

U.S. PATENT DOCUMENTS

| | | | |
|---|---|---|---|
| 2,640,901 | 6/1953 | Kinman | 357/30 |
| 3,423,594 | 1/1969 | Galopin | 357/30 |
| 3,532,873 | 10/1970 | Batson et al. | 357/19 |
| 3,708,732 | 1/1973 | Faust | 357/81 |
| 3,796,881 | 3/1974 | Roberts | 357/38 |
| 3,840,889 | 10/1974 | O'Brien et al. | 357/72 |
| 3,886,581 | 5/1975 | Katsumura | 357/75 |
| 4,016,593 | 4/1977 | Konishi et al. | 357/38 |
| 4,079,511 | 3/1978 | Grabbe | 357/74 |

*Primary Examiner*—Andrew J. James
*Attorney, Agent, or Firm*—Harry Max Weiss

[57] ABSTRACT

A plastic encapsulated integrated circuit (IC) package is disclosed which includes a conical depression or dimple precisely located over a photo-responsive semiconductor element incorporated within said integrated circuit for performing a predetermined function. The IC is encapsulated in a clear, two-part epoxy moulding compound preferably Hysol MG-18 having a tapered small depression positioned to register with the photo element but stopping short of actually touching the semiconductor photo element.

Thus, the bottom of the tapered depression consists of a transparent window of sufficient thickness to protect the semiconductor element and still provide optical coupling. The minimum diameter of the light input depression located preferably at the top of the clear plastic package is designed to receive a snug fitting light pipe of Lucite or other clear material that could be used as a fiber optic element. The light pipe can be retained in the IC depression by mechanical means or optionally it can be cemented in place. A suitable light source for activating the photo-responsive semiconductor element in the IC may be a light emitting diode or an incandescent lamp.

10 Claims, 3 Drawing Figures

INTEGRATED CIRCUIT PACKAGE WITH OPTICAL INPUT COUPLER

BACKGROUND OF THE INVENTION

1. Field of the Invention

This invention relates generally to integrated circuit packages to accommodate one or more light sources, and more particularly, to integrated circuit packages having light coupling inputs.

2. Description of the Prior Art

A great deal of inventive effort has been devoted to the generation of electrical impulses from specialized light sources and to the elimination of the effects of ambient light with modulators, collimeters, lense systems, selective filters, etc.

A more recent field of interest in the opto-electronics technology concerns the transmission of light through specially designed optical glass fibers and/or through plastic light pipes which act as wave guides or light guides and to the generation and recovery of optical signals therefrom.

Prior art which is related to the opto-electronic technology and may also be related to this disclosure is cited as follows:

U.S. Pat. No. 3,982,123 issued Sept. 21, 1976 to J. E. Goell et al., discloses a variety of arrangements for tapping off a portion of the light signal from an optical fiber wave guide without requiring that the fiber be terminated or cut. This is done with a grooved or slotted clear plastic coupling body (which body also contains a photodetector) whose index of refraction is equal to or greater than the usual cladding material that is used on each fiber optic element. This patent deals exclusively with taking a signal off of an optical fiber without terminating or cutting the fiber, but does not remove a signal from a terminated light pipe and does not disclose an IC type package.

U.S. Pat. No. 3,977,762 issued Aug. 31, 1976 to C. P. Sandbak, describes an optical coupler consisting of a linear array of optical wave guides arranged to direct information from a document to a photosensor module. A plurality of optical wave guides are spaced along the document and compressed adjacent to the photosensor array. This patent describes a special purpose optical coupler with a plurality of inputs and outputs based on glass fiber optic technology, but no IC type package is disclosed.

U.S. Pat. No. 3,968,564 issued July 13, 1976 to A. J. Springthorpe, describes a method of accurately aligning a fiber optic wave guide with a light emitting diode by etching a clearance hole in a substrate centered over the diode. This patent does not disclose an integrated circuit package with optical input means.

U.S. Pat. No. 3,948,582 issued Apr. 6, 1976 to D. J. Martin describes an optical fiber connector set consisting of a plug whereby the male connector element is the end of an optical fiber wave guide and the female connector element consists of a conical plastic socket terminated with a fiber optic section. The mating plug and socket is either bayonet connected or threaded together with a freely rotatable outer sleeve. When the plug and socket of this prior art patent are mated, the two fiber glass ends are in contact or are very closely spaced apart. U.S. Pat. No. 3,948,582 also includes a double female adaptor for joining two fiber optic wave guide sections which are quipped with plugs. While U.S. Pat. No. 3,948,582 includes a cavity designated for a light emitter or detector in the female receptical, this prior art patent concerns mechanical details of a plug, socket, and adaptor and does not disclose an integrated circuit package or optical coupler.

U.S. Pat. No. 3,944,328 issued Mar. 16, 1976 to A. H. Kent et al., describes a device for in-line coupling of two lengths of optical wave guide elements. Also a subject of this patent is a method of casting a suitably dimensioned coupling block from a two-part epoxy. The fiber optic ends are fastened in the coupler with a high refractivity transparent cement. There is no disclosure or teaching in this patent of an integrated circuit package with an optical input coupler.

U.S. Pat. No. 3,757,127 issued Sept. 4, 1973 to Vir A. Dhaka, describes a photodetector assembly consisting of a square photodetector array with a plurality of photo-responsive elements coupled to fiber optic wave guides. The photodetector assembly is mounted in a square apertured retainer to facilitate attachment to a formed and cemented bundle of fiber optics so each fiber optic wave guide is coupled to a photo element on a one to one basis. Thus, the luminous information on each fiber optic is converted to a separate electrical signal. This patent does not disclose an integrated circuit package.

U.S. Pat. No. 3,423,594 issued Jan. 21, 1969 to A. G. Galopin, describes a photosensitive semiconductor device in which a plurality of fiber optic light rods are coupled to a light sensitive base portion of what is essentially a phototransistor. Combinations of light signals on the fiber optics and design features of the phototransistor will permit several varieties of logic mixing, modulation, demodulation, and integration functions to be performed. Progressive energization of the fiber optics inputs will produce step functions in the output circuit. This patent combines the inputs of a plurality of fiber optics into a single output signal. However, this prior art patent does not disclose an integrated circuit package.

U.S. Pat. No. 2,640,901 issued June 2, 1953 to T. H. Kinman, describes the use of discrete semiconductor devices, namely, a point contact germanium diode and a point contact germanium transistor which function as photoelectric devices by the addition of an acrylic or quartz light pipe arranged to illuminate the germanium device in the vicinity of the point contact. This patent also does not disclose an integrated circuit package.

The prior art described above is only a few of many patents that have been issued relating to opto-electronic semiconductor devices. However, none of the cited prior art is directed to the problem of coupling light into an IC package which includes a photo-responsive device. Furthermore, none of this prior art is directed to the problem of efficiently coupling light into an IC package while still permitting the semiconductor chip in the package to be properly protected by a suitable encapsulating material.

Accordingly, a need existed for a simple, cost effective, technique of providing an optical input to an integrated circuit package.

SUMMARY OF THE INVENTION

Accordingly, it is an object of this invention to provide an integrated circuit package with the capability of combining one or more optical inputs external to the package with one or more electrical inputs to perform a predetermined electronic function and to produce a desired output or outputs.

It is another object of this invention to provide a simple cost effective way to couple light energy from a light pipe to an integrated circuit package.

It is a further object of this invention to provide a method of moulding a dual in-line integrated circuit package having optical input means out of a clear two-part epoxy moulding compound which serves as both an encapsulant for the semiconductor chip of the package and also a light transmitting medium.

The foregoing, and other objects, features, and advantages of the invention will be apparent from the following, more particular description of the preferred embodiment of the invention, as illustrated in the accompanying drawing.

THE SPECIFICATION

Figure 1:
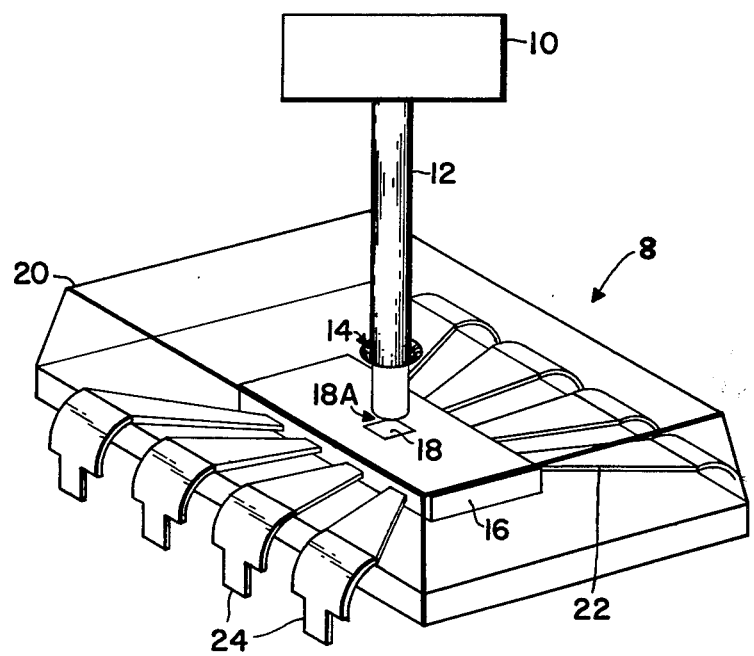
FIG. 1 is a side elevational view of the dual in-line integrated circuit package constructed in accordance with this invention.

Referring to FIG. 1, a side elevational view of an integrated circuit package 8 of this invention is shown which includes an Integrated Circuit Chip 16 preferably encapsulated by a clear epoxy material 20. Hysol MG-18 manufactured by Dexter Corporation has proved to be a satisfactory encapsulating material or moulding compound to serve as the encapsulating material 20.

A light source 10 preferably a light emitting diode, is coupled to a light pipe 12 which is preferably made of an acrylic or other optically suitable material having a diameter of ⅛ inch or less. The light pipe 12 is either press fitted or cemented into a light input recess 14 shown located in the upper surface of the encapsulating material 20. This light input recess 14 is carefully positioned to register with a light sensitive area (or photo-responsive device) 18 on the Integrated Circuit Chip 16. The depth of the light input recess 14 in the clear epoxy encapsulating material 20 is carefully chosen to provide maximum optical coupling to the photo-responsive device 18. Separation of the end of the light pipe 12 and the active photo-responsive device 18 is shown by reference numeral 18A.

To reduce internal scattering, distance 18A should be made as small as possible. One embodiment of the invention as illustrated in FIG. 1 shows an eight pin DIP (dual in-line package) as shown by pins 24 and lead frame 22 which is electrically and mechanically connected to the pins 24.

Figure 2:
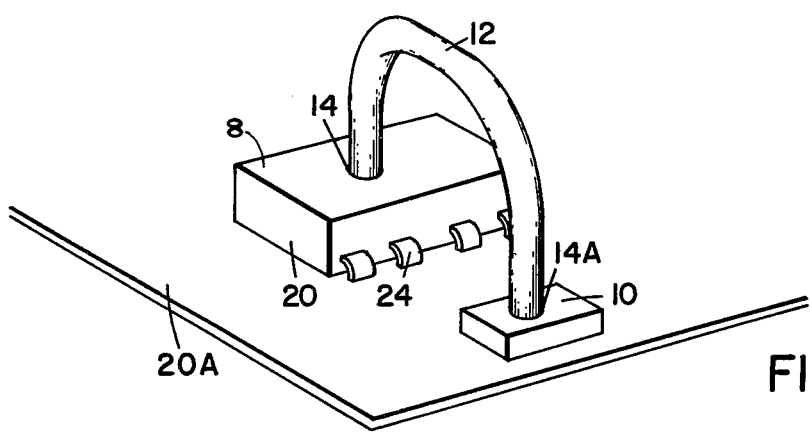
FIG. 2 shows a perspective view of a light emitting type of device optically coupled to an integrated circuit package having a photo-responsive device with both the package and the photo-responsive device being mounted.

FIG. 2 shows an alternate embodiment wherein both the Integrated Circuit Package 8 and the light source 10 are mounted on a printed circuit board 20A. In this case, the acrylic light pipe 12 is bent preferably in a uniform arc to fit between a light source 14A in the light source 10 and the light input recess 14 in the Integrated Circuit Package 8. The Integrated Circuit Package 8 is shown as an 8-lead or pin DIP, but can be a lead frame or other package having any number of pins. The cooperation between the light source recess 14A and the light input recess 14 offers a simple means of manually connecting the Integrated Circuit Package 8 to any one of several light sources 14A. This permits very rapid coupling and uncoupling between an integrated circuit source and several light sources without the need for precise alignment because of the self alignment feature of the input and output recesses. The encapsulating material 20 thus provides a triple function by serving as the encapsulant for the semiconductor chip, a light coupling medium between a photo-responsive element and a light pipe, and as a means for supporting and aligning one end of a light pipe.

APPLICATIONS

The integrated circuit package size, i.e. number of pins and number of light inputs and the number and type of photosensitive areas on the chip will depend on the planned end use of the invention. An eight pin integrated circuit package configuration is generally adequate for most light operated relay applications. An important advantage of this invention operating as a relay is the very high degree of isolation that is achieved between the input and output signals. This isolation can be maintained under nearly all conditions, providing a light source with the same isolation is available. This isolation includes capacitive isolation and a very high resistance is provided between input and output. This type of relay can be operated by a signal many kilovolts above ground potential if a common voltage for the light source is made available.

If it is desired that relay operation be based on the presence or absence of light, the photosensitive area on the semiconductor chip can be a photodiode with amplification. Gallium Arsenide Infra-Red (IR) and other LEDs (Light Emitting Diodes) are semi-coherent energy sources and can be pulsed at mega bit rates and therefore are suitable for use as a pulse code modulator. Demodulation of signals with high pulse rates requires special design of the photodetector and the associated amplifier. If the relay is to operate at a light threshold value or on light differential values, a phototransistor with adjustable bias can be used. If an external control is used for a turn-off function, a light activated silicon controlled rectifier (LASCR) could be used for an on-off function with higher power control capability.

A photoresistor or a properly biased phototransistor will permit the integrated circuit package to be used for demodulation of amplitude modulated light signals. If an RF carrier is introduced into the chip, a modulated RF signal can be generated from a demodulated light signal.

An integrated circuit with a combination of optical and electrical inputs can be designed to perform a variety of fuctions, such as logic, control, modulation, demodulation, amplification, etc. A semiconductor chip designed for a complex application can be mounted on a 14 or 16 pin lead frame if more terminals (inputs or outputs) are needed. It is also possible to install the light sensitive element that is shown herein to be within the integrated circuit package as an element or device separate from the main chip. Also, the separate photo-active element could be a LED in which case the LED device could be driven by the integrated circuit, and, thus, the integrated circuit becomes a controlled light output coupler instead of a receptor.

FABRICATION

Figure 3:
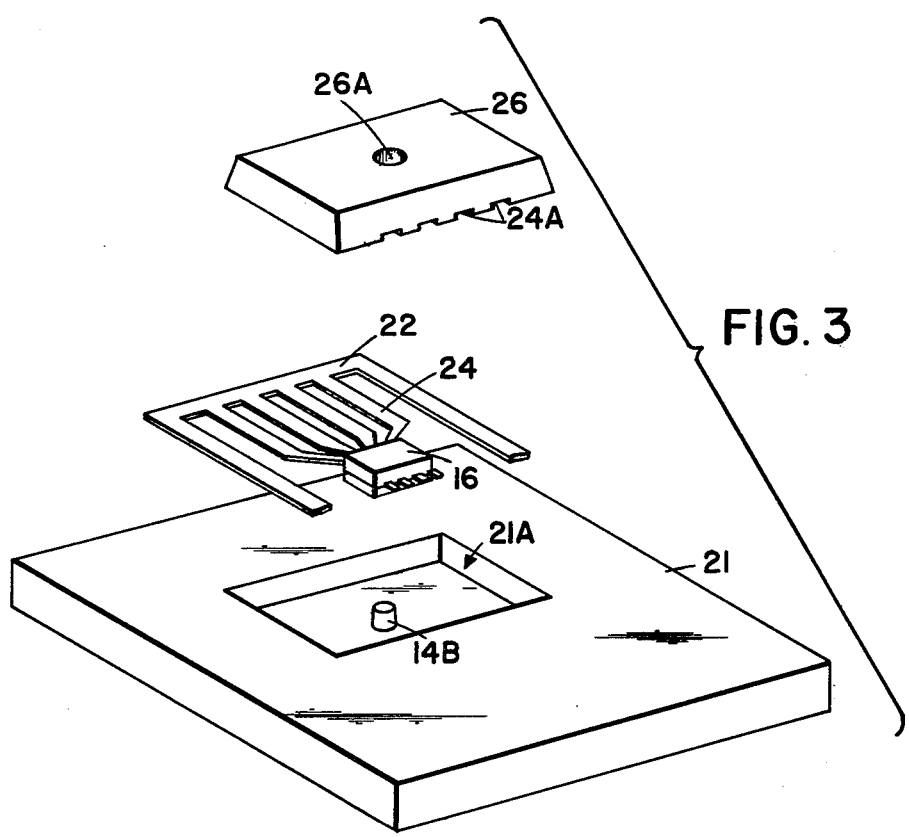
FIG. 3 shows a sectioned or two-part mould which permits the integrated circuit lead frame a package with the electrically connected semiconductor chip and supporting substrate to be cast in transparent plastic.

FIG. 3 shows a mould set which may be used for encapsulation of an electrically connected integrated circuit package that includes the led frame 22. The I.C. package is encapsulated by HYSOL MG-18 clear epoxy or other suitable clear casting plastic. Mould body 21 preferably consists of a semirigid silicone or other composition with good release characteristics when used with a releasing agent. Recess 21A which determines the size of the finished encapsulated integrated circuit package should be properly tapered to aid in release and should also be about twice as thick as a standard integrated circuit package to allow room for correct depth for the light pipe recess which is to be located or formed in the integrated circuit encapsulation by plug 14B.

To encapsulate an electrically connected integrated circuit, the lead frame 22 with its uncut and unformed pins 24 and its semiconductor chip 16 is carefully positioned over the recess 21A. Cover 26 which forms the bottom of the integrated circuit package, is placed over the lead frame 22 with cutouts 24A aligned over pin leads 24.

The epoxy moulding compound is preferably introduced slowly through hole 26A and this is done in a manner to exclude air bubbles and fill all portions of the mould. When the plastic is cured, both halves of the mould should be easy to remove thereby leaving the finished I.C. encapsulated package with its precisely formed recess for optical coupling.

While the invention has been particularly shown and described in reference to the preferred embodiment thereof, it will be understood by those skilled in the art that changes in the form and details may be made therein without departing from the spirit and scope of the invention.

I claim:

1. An integrated semiconductor structure comprising, in combination, an integrated circuit package, an integrated semiconductor device having external electrical connections mounted on said integrated circuit package, said integrated semiconductor device being electrically connected to said package, a clear dielectric encapsulant material located on said integrated semiconductor device and in contact with said package, and recess means located in one surface of said clear dielectric encapsulant material and within said clear dielectric encapsulant material for permitting coupling of light to said integrated semiconductor device a light coupling element having one end located in said recess means, said integrated semiconductor device having a light responsive device located directly beneath said recess means in said clear dielectric encapsulant material.

2. An integrated semiconductor circuit structure in accordance with claim 1 wherein said recess means comprising a conical shaped recess located in a top surface of said clear dielectric encapsulant material being made of plastic.

3. An integrated semiconductor structure in accordance with claim 1 wherein said clear dielectric encapsulant material being made of plastic.

4. An integrated semiconductor structure in accordance with claim 3 wherein said plastic being Hysol MG-18.

5. An integrated semiconductor structure in accordance with claim 4 wherein said recess means comprising a small conical shaped recess located in a top surface of said Hysol MG-18 plastic encapsulating material.

6. An integrated semiconductor structure in accordance with claim 2 wherein said light responsive device in said integrated semiconductor structure being spaced from the bottom of said conical shaped recess, a portion of said clear dielectric encapsulant material being located above said light responsive device and below the bottom of said conical shaped recess.

7. An integrated semiconductor structure in accordance with claim 1 wherein said integrated package being a Dual In Line package.

8. An integrated semiconductor structure in accordance with claim 1 wherein said light coupling element comprising a light pipe element having one end located in said recess means.

9. An integrated semiconductor structure in accordance with claim 8 including a light emitting device coupled to the other end of said light pipe element.

10. An integrated semiconductor structure in accordance with claim 8 wherein both said integrated circuit package and said light emitting device being electrically and mechanically connected to the same printed circuit board.